US008796073B2

(12) United States Patent
Gu et al.

(10) Patent No.: US 8,796,073 B2
(45) Date of Patent: Aug. 5, 2014

(54) LOW COST DIE-TO-WAFER ALIGNMENT/BOND FOR 3D IC STACKING

(75) Inventors: Shiqun Gu, San Diego, CA (US); Thomas R. Toms, Dripping Springs, TX (US)

(73) Assignee: QUALCOMM Incorporated, San Diego, CA (US)

( * ) Notice: Subject to any disclaimer, the term of this patent is extended or adjusted under 35 U.S.C. 154(b) by 1087 days.

(21) Appl. No.: 12/236,967

(22) Filed: Sep. 24, 2008

(65) Prior Publication Data

US 2010/0075460 A1 Mar. 25, 2010

(51) Int. Cl.
*H01L 21/00* (2006.01)

(52) U.S. Cl.
USPC ............ 438/107; 438/455; 438/458; 438/462

(58) Field of Classification Search
USPC .......... 438/107, 109, 110, 113, 455, 458, 462
See application file for complete search history.

(56) References Cited

U.S. PATENT DOCUMENTS

| 7,354,862 | B2 | 4/2008 | Wong et al. |
| 7,492,179 | B2 | 2/2009 | Chiu et al. |
| 2003/0015792 | A1 | 1/2003 | Urakawa |
| 2006/0234473 | A1 | 10/2006 | Wong |
| 2006/0249859 | A1 | 11/2006 | Eiles |
| 2007/0236238 | A1 | 10/2007 | Chiu |
| 2008/0157405 | A1 | 7/2008 | Knickerbocker |

FOREIGN PATENT DOCUMENTS

| JP | 2003023138 A | 1/2003 |
| JP | 2005026346 A | 1/2005 |
| JP | 2007081296 A | 3/2007 |
| WO | 9959207 | 11/1999 |
| WO | 2005122706 | 12/2005 |
| WO | WO2007018850 A2 | 2/2007 |

OTHER PUBLICATIONS

International Search Report—PCT/US2009/057515, International Search Authority—European Patent Office Mar. 26, 2010.
Written Opinion—PCT/ US2009/057515, International Search Authority—European Patent Office Mar. 26, 2010.

*Primary Examiner* — Jack Chen
(74) *Attorney, Agent, or Firm* — Sam Talpalatsky; Nicholas J. Pauley; Joseph Agusta

(57) ABSTRACT

The cost associated with alignment in a stacked IC device can be reduced by aligning multiple die instead of a single die during the alignment step. In one embodiment, the alignment structures are placed in the scribe line instead of within the die itself. Aligning four die instead of one eliminates the need for as many alignment indicators and thus more silicon on the wafer can be used for active areas. In addition, this method allows for yield improvement through binning of dies having the same yield configuration.

13 Claims, 7 Drawing Sheets

LOW COST DIE-TO-WAFER ALIGNMENT/BOND FOR 3D IC STACKING

TECHNICAL FIELD

The present disclosure relates to integrated circuits (ICs). More specifically, the disclosure relates to multi-tiered IC devices and even more specifically to low cost die-to-wafer alignment.

BACKGROUND

In IC technology there is a need to stack chips together to form multi-tiered (3-D) IC devices (also referred to as multi-layered IC devices or stacked IC devices). This is ordinarily accomplished in one of two ways: wafer-to-wafer bonding or die-to-wafer bonding.

Wafer-to-wafer bonding generally describes a technique where the wafers are aligned and bonded face to face or back to face and then thinned and interconnected prior to additional stacking processes or dicing. Wafer-to-wafer bonding has the advantage of a high throughput, but generally results in low yield percentages. The low yield arises from the random location of defective sub-devices within the wafers to be stacked. The cumulative yield of the stacking process is approximately the product of the individual tiers yields in the stack furthermore the wafer-to-wafer bonding has a requirement that the die size be the same between the tiers to be bonded.

Die-to-wafer bonding generally describes a technique where individual die from a "donor" wafer are cut from the donor wafer and subsequently aligned with die (that have not been cut) from a "receiver" wafer. Although die-to-wafer bonding has a higher yield than wafer-to-wafer bonding and does not require the die to be the same size, it results in a lower throughput because each die needs to be aligned with its corresponding die on the receiver wafer. The challenge that accordingly arises is the reduction of time and cost associated with aligning each die to a receiver wafer.

BRIEF SUMMARY

The present disclosure is directed to lowering costs associated with die alignment in die-to-wafer stacking for 3-D IC devices. Specifically, one embodiment is directed to bonding multiple (N) die to a wafer with a single alignment rather than the conventional method of bonding one die per alignment. Thus, the throughput of alignment and bonding steps will increase by N times.

In one embodiment, a method of die alignment comprises orienting a first group of die for a first tier of a stacked IC device such that the first group has an axis of symmetry. The method also includes orienting a second group of die for a second tier of the stacked IC device such that the second group has an axis of symmetry. The method further includes aligning the axis of symmetry of the first group to the axis of symmetry of the second group to enable stacking of the first and second groups of die during manufacturing of the stacked IC device.

The foregoing has outlined rather broadly features and technical advantages in order that the detailed description that follows may be better understood. Additional features and advantages will be described hereinafter which form the subject of the claims of the invention. It should be appreciated by those skilled in the art that the conception and specific embodiment disclosed may be readily utilized as a basis for modifying or designing other structures for carrying out the same purposes of the present invention. It should also be realized by those skilled in the art that such equivalent constructions do not depart from the spirit and scope of the invention as set forth in the appended claims. The novel features which are believed to be characteristic of the invention, both as to its organization and method of operation, together with further objects and advantages will be better understood from the following description when considered in connection with the accompanying figures. It is to be expressly understood, however, that each of the figures is provided for the purpose of illustration and description only and is not intended as a definition of the limits of the present invention.

BRIEF DESCRIPTION OF THE DRAWINGS

For a more complete understanding of the embodiments of present invention, reference is now made to the following descriptions taken in conjunction with the accompanying drawings, in which.

DETAILED DESCRIPTION

Figure 1:
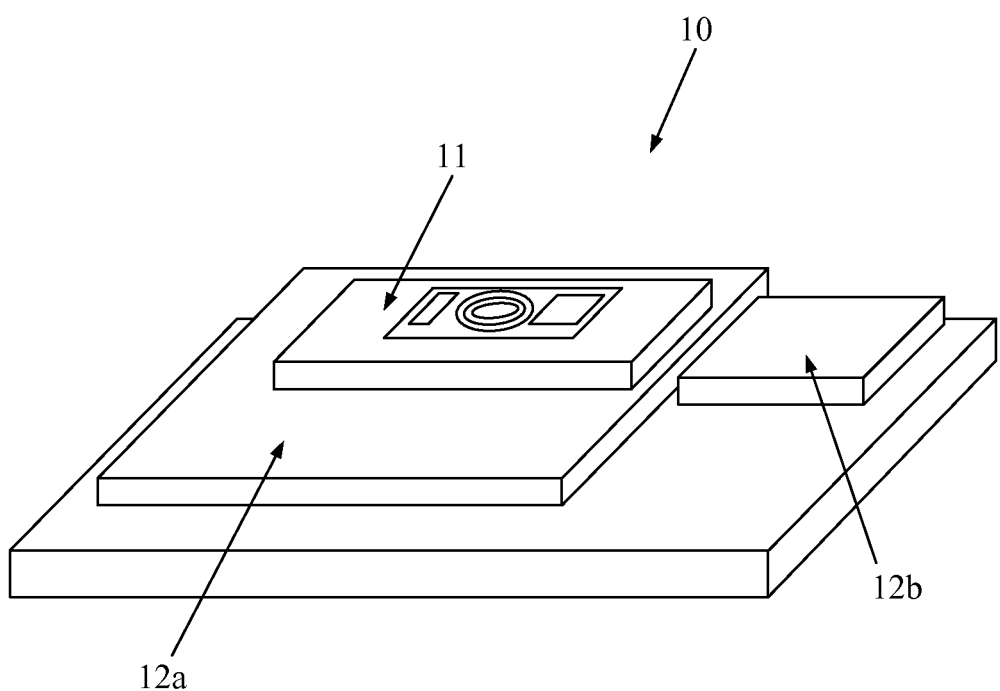
FIG. 1 is a schematic drawing of a multi-tiered IC device.

FIG. 1 is a schematic drawing of a multi-tiered IC device 10 having a top layer 11 and a bottom layer including two die 12a and 12b. The top layer 11 and one of the die from the bottom layer 12a are bonded together using conventional techniques known in the art. This bonding creates stacked IC device 11/12a. The benefits of such a stacked IC device are known in the art—such stacked IC devices allow for devices to maintain a small form factor, allow for system partition capability, and improve performance. However, as discussed above, there are many challenges associated with the fabrication of such stacked IC devices, such as minimizing the cost required to align and bond the die 11 and 12a. The die 12b is not part of a stacked configuration, in the embodiment shown in FIG. 1.

Figure 2:
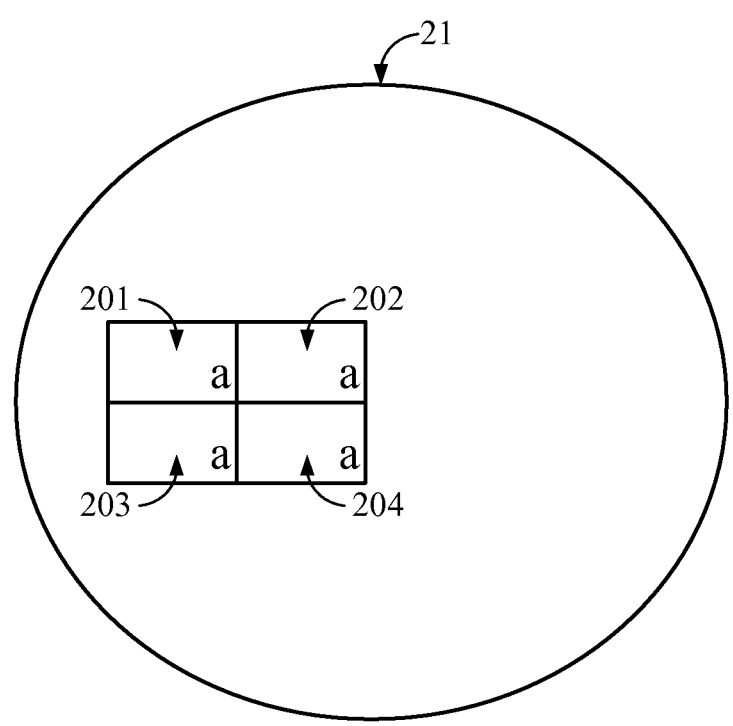
FIG. 2 is a schematic drawing of a "receiver" wafer using a conventional method.

FIG. 2 is a schematic drawing of die placement on a monolithic receiver wafer 21 using a conventional method. As can be seen in the figure, die 201, 202, 203, and 204 all have the same orientation. Specifically, alignment indicator a is used to define the orientation of the die 201, 202, 203, and 204, respectively, to the receiver wafer 21. Reference structure a can be found in the bottom right corner of the die 201, 202, 203, and 204. These alignment indicators can also be found elsewhere on the die as dictated by the design of the IC and are illustrated in the bottom right corner only for the sake of this description.

Figure 3:
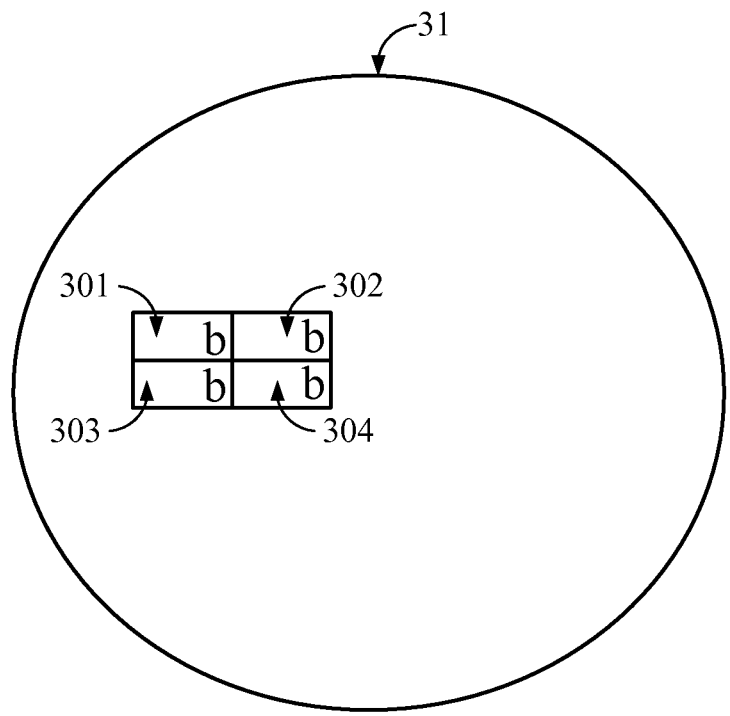
FIG. 3 is a schematic drawing of a "donor" wafer using a conventional method.

FIG. 3 is a schematic drawing of a monolithic donor wafer 31 using a conventional method. As can be seen in the figure, the die 301, 302, 303, and 304 all have the same orientation. Specifically, reference structure b can be found in the bottom right corner of the die 301, 302, 303, and 304, respectively. These alignment indicators can also be found on the die as dictated by the design of the IC and are illustrated in the bottom right corner only for the sake of this description.

Figure 4:
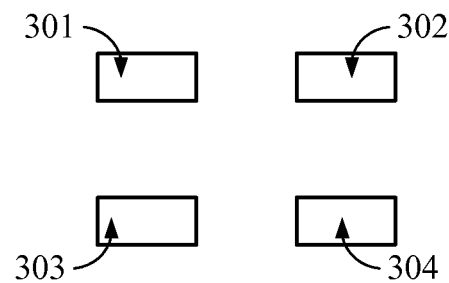
FIG. 4 is a schematic drawing of a die after it is cut from the "donor" wafer using a conventional method.

FIG. 4 is a schematic drawing of the die 301 of FIG. 3 after it has been cut out of the wafer 31. The conventional cutting process is well known in the art and examples include lasers and diamond saws. Notably, the conventional method requires the manufacturer to cut one die at a time. Therefore, the die 302, 303, and 304 would be similarly individually and sequentially cut from wafer 31 and are also illustrated in FIG. 4.

Figure 5:
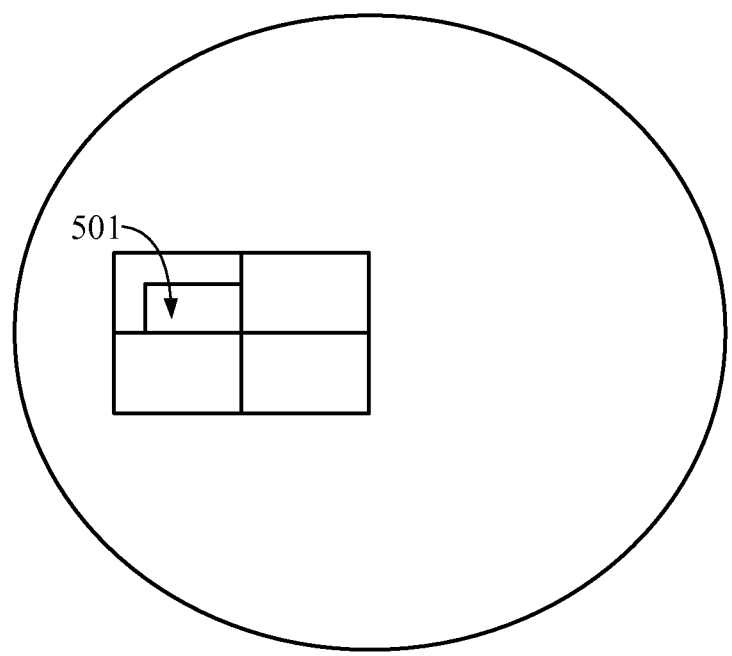
FIG. 5 is a schematic drawing of alignment using a conventional method.

FIG. 5 is a schematic drawing of the alignment performed during the bonding process using the conventional method. The alignment process can use multiple techniques. Examples include BCB, oxide-to-oxide, Cu—Cu, Cu—X—Cu, micro-bumping, and the combination. It is the physical orientation of the alignment process that limits alignment to a single site. That is, after one alignment process, only one die from the donor wafer 31 is aligned with one die from the receiver wafer 21, resulting in only one completed die stack 501. The process illustrated by FIG. 5 subsequently must be repeated to align the die 302 to the die 202, the die 303 to the die 203, and the die 304 to the die 204.

Figure 6:
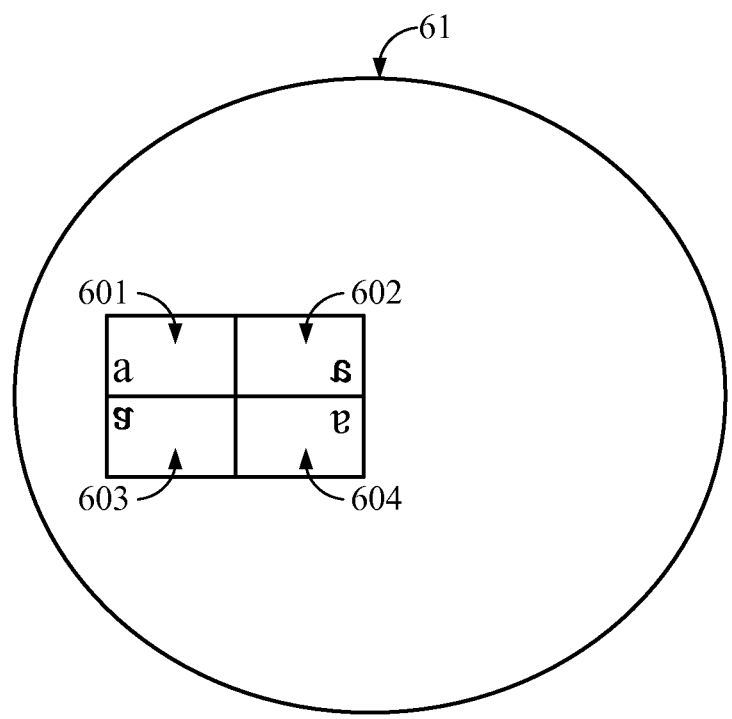
FIG. 6 is a schematic drawing of a "receiver" wafer using an embodiment of the present invention.

FIG. 6 is a schematic drawing of a monolithic receiver wafer 61 using an exemplary method of the present disclosure. As can be seen in the figure, the die 601, 602, 603, and 604 do not have the same orientation. Specifically, reference structure a is used to define the orientation of the die 601, 602, 603, and 604, respectively, to the receiver wafer 61. Reference structure a can be found in the bottom left corner of the die 601 and in the bottom right corner of the die 602, in the top left corner of the die 603, and in the top right corner of the die 604, respectively.

This difference in orientation is achieved by flipping and rotating the die placement such that all four die share a common origin. This placement can be accomplished by a modification to photolithography reticles involved in the fabrication process. This modification should allow for such differences in die orientation. If the process alternatively incorporates reticles with only one die per shot, this orientation difference can be accomplished by modification to the stepper so that the reticles are rotated to provide the correct orientation for each shot. In most cases, the one reticle can contain multiple die and the symmetry can be handled during reticle fabrication.

Figure 7:
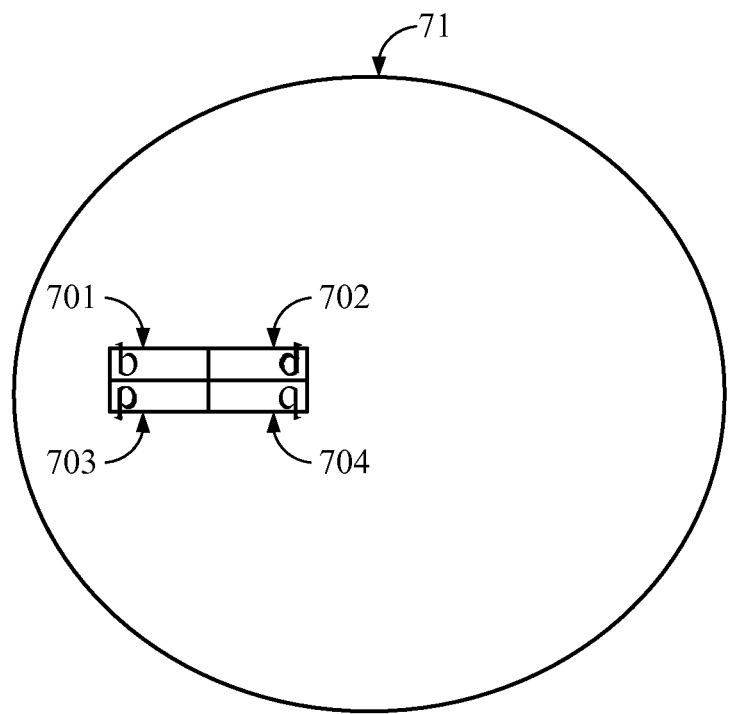
FIG. 7 is a schematic drawing of a "donor" wafer using an embodiment of the present invention

FIG. 7 is a schematic drawing of a monolithic donor wafer 71 using an exemplary method of the present disclosure. As can be seen in the figure, the die 701, 702, 703, and 704 do not have the same orientation. Specifically, reference structure b is used to define the orientation of the die 701, 702, 703, and 704, respectively, to the receiver wafer 71. Reference structure b can be found in the bottom left corner of the die 701 and in the bottom right corner of the die 702, in the top left corner of the die 703, and in the top right corner of the die 704, respectively. This difference in orientation is achieved by flipping and rotating the die placement such that all four die share a common origin. This can be accomplished by a modification to all photolithography reticles involved in the fabrication process, as described above.

Figure 8:
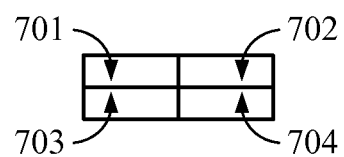
FIG. 8 is a schematic drawing of die after they are cut from the "donor" wafer using an embodiment of the present invention.

FIG. 8 is a schematic drawing of a group of the die 701, 702, 703, and 704 of FIG. 7 after they have been cut out of the wafer 71. As discussed above with reference to FIG. 4, examples of the cutting process include lasers and diamond saws. However, unlike the known conventional methods, the present method enables the manufacturer to cut multiple die at one time. Therefore, although the conventional method (as illustrated in FIG. 4) required the manufacturer to cut each die out one-by-one, the present disclosure teaches multiple die with the same alignment indicator (i.e., a group) cut out at one time.

Figure 9:
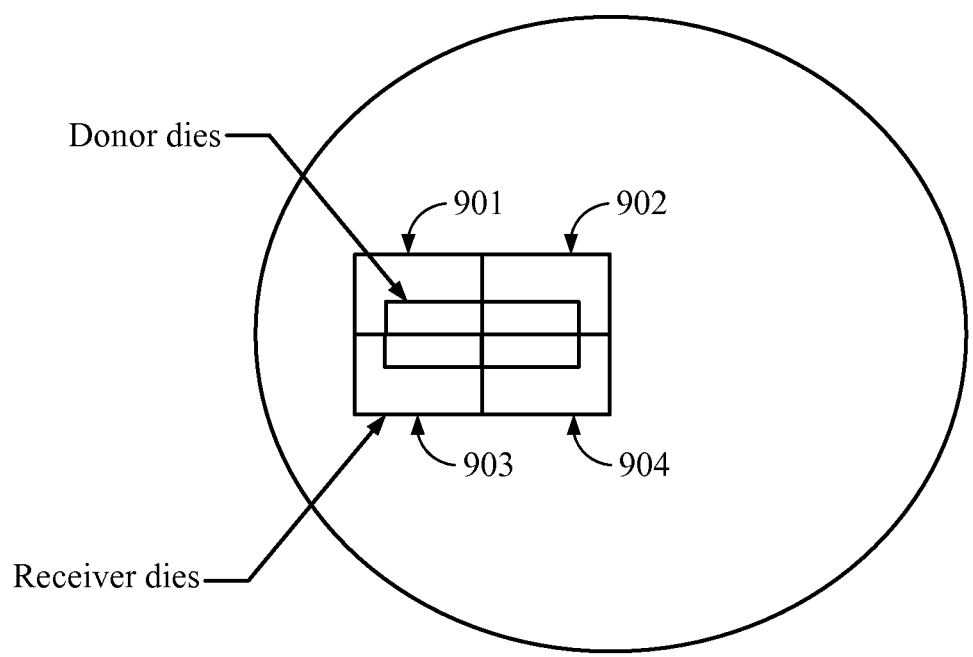
FIG. 9 is a schematic drawing of alignment using an embodiment of the present invention.

FIG. 9 is a schematic drawing of an alignment performed during exemplary bonding process using the present disclosure. Examples of the alignment process include tracking alignment keys or characteristic patterns located on bottom and top tiers through microscopes, moving one tier so that the alignment keys from bottom and top tier lined up within a specific tolerance. The present disclosure allows for multiple die to be aligned at a time. That is, after one alignment process, multiple die from the donor wafer 71 are aligned with multiple die from the receiver wafer 61, thus resulting in completed die stacks 901, 902, 903, and 904. This method increases throughput by decreasing the time required for alignment as compared to the method described above in conjunction with FIG. 5.

It is important to note that although four die have been shown in FIGS. 6-9, this number is for illustration purposes only. The present disclosure enables multiple die to be aligned in each alignment process and is not limited to four. For example, a group of two die could be used in the donor wafer. Although the examples have shown die stacked with a corner of each tier being aligned, by providing unused silicon (or similar material) between the die of the donor wafer, the tier to tier alignment need not have aligned corners. Moreover, although die to wafer stacking has been described, die to die stacking is also contemplated.

In another embodiment, the problem of defective die impacting yield is addressed. Different bins can store die groups based upon which die in a group (if any) are defective. For example, referring again to FIG. 6, assume die 601 is defective, whereas the other die are good. Such a group would be stored in a bin with other groups having the upper left die as defective. Similarly, other bins store different configurations of defective/good die.

Corresponding bins for the donor die also store donor die groups based upon the good/defective die configuration within the group. In order to improve yield, receiver bins and donor bins are matched based upon the configuration of groups within each bin. In other words, a donor bin storing groups of donor die having an upper left die that is defective is matched with a receiver bin storing groups of receiver die with an upper left defective die. By selecting groups of die from the matching bins, stacked ICs can be created in which the defective die are stacked upon each other. Consequently, the IC stack having the defective die can be removed. Without such an improvement, a bad die could be stacked upon a good die, resulting in a bad stacked IC, even though one of the tiers includes a good die.

Figure 10:
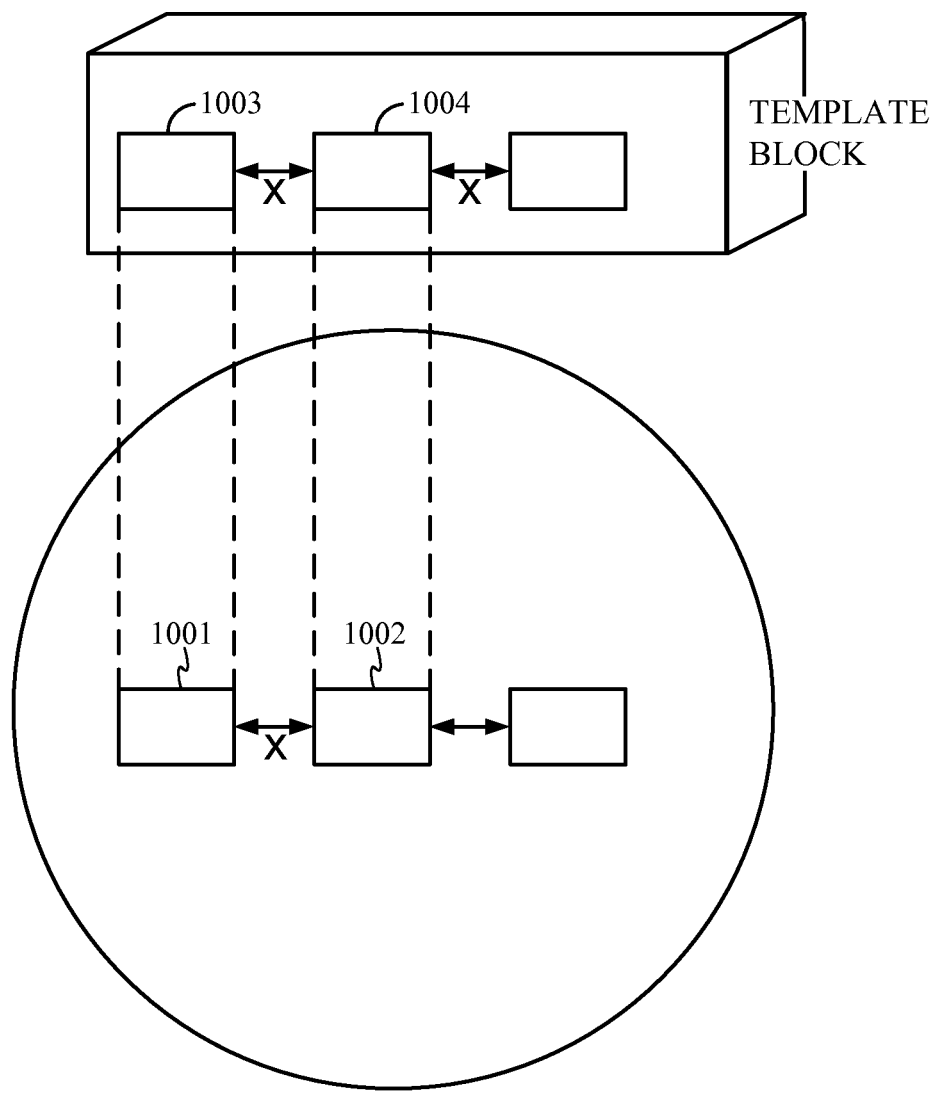
FIG. 10 is a schematic drawing of an alternate embodiment of the present invention.

In an alternate embodiment, multiple sets of donor die (a die group from a first tier) are picked up at the same time. The multiple sets of die groups can be pre-aligned onto a template block and the template block can be aligned to the receiver die or wafer of a second tier. Specifically, FIG. 10 illustrates that a distance measurement x may be obtained between a receiver die group 1001 and a receiver die group 1002 of the second tier. A template block can subsequently be created that allows a donor die group 1003 and a donor die group 1004 (i.e., a set of donor die groups of the first tier) to be placed x distance apart in order to be bonded with the receiver die group 1001 and the receiver die group 1002, respectively. Accordingly, a single alignment can align multiple sets of die groups. Although receiver die groups are described, a receiver wafer could also be used.

In yet another alternate embodiment, the alignment structures can be placed in the scribe line as opposed to on the die themselves. This embodiment allows for a greater amount of silicon to be available for active areas rather than having to use the silicon for the alignment structure. An advantage of the embodiment is that by requiring fewer alignment processes, fewer alignment indicators are needed, thus making even more silicon available for use in active areas.

Although the present invention and its advantages have been described in detail, it should be understood that various changes, substitutions and alterations can be made herein without departing from the spirit and scope of the invention as defined by the appended claims. Moreover, the scope of the present application is not intended to be limited to the particular embodiments of the process, machine, manufacture, composition of matter, means, methods and steps described in the specification. As one of ordinary skill in the art will readily appreciate from the disclosure of the present invention, processes, machines, manufacture, compositions of matter, means, methods, or steps, presently existing or later to be developed that perform substantially the same function or achieve substantially the same result as the corresponding embodiments described herein may be utilized according to the present invention. Accordingly, the appended claims are intended to include within their scope such processes, machines, manufacture, compositions of matter, means, methods, or steps.

What is claimed is:

1. A method of aligning die for a stacked IC device, comprising:
    orienting a first plurality of die for a first tier of the stacked IC device such that the first plurality has an axis of symmetry;
    orienting a second plurality of die for a second tier of the stacked IC device such that the second plurality has an axis of symmetry; and
    aligning the axis of symmetry of the first plurality to the axis of symmetry of the second plurality to enable stacking of the first and second pluralities of die during manufacturing of the stacked IC device.

2. The method of claim 1 wherein the axis of symmetry for the first and second plurality of die is horizontal symmetry.

3. The method of claim 2, wherein the first and second plurality of die each have a second axis of symmetry and wherein the second axis of symmetry for the first and second plurality of die is vertical symmetry.

4. The method of claim 1 wherein the axis of symmetry for the first and second plurality of die is vertical symmetry.

5. The method of claim 1 wherein:
    the first plurality of die comprises at least two die; and
    the second plurality of die comprises at least two die.

6. The method of claim 1 wherein the first plurality of die contains the same number of die as the second plurality of die.

7. The method of claim 1 wherein:
    the first plurality of die comprises at least four die; and
    the second plurality of die comprises at least four die.

8. The method of claim 1 wherein:
    the first plurality of die comprises die that have been cut from a wafer.

9. The method of claim 8 wherein:
    the second plurality of die comprises die that have been cut from a wafer.

10. The method of claim 8 wherein:
    the second plurality of die comprises die that have not been cut from a wafer.

11. The method of claim 8 wherein the first plurality of die are cut from a monolithic wafer.

12. The method of claim 1 wherein the first and second plurality of die have alignment indicators and wherein the alignment indicators are located in scribe lines of each of the pluralities of die, the method further comprising scribing, wherein the scribe lines are cut away.

13. The method of claim 1, wherein the orienting of at least one of the first plurality of die or the second plurality of die comprises:
    flipping and rotating a die placement such that each of the first plurality of die or the second plurality of die share a common origin.

* * * * *